US011155754B2

(12) United States Patent
Kasai et al.

(10) Patent No.: US 11,155,754 B2
(45) Date of Patent: Oct. 26, 2021

(54) COMPOSITION AND DISPLAY DEVICE

(71) Applicant: SUMITOMO CHEMICAL COMPANY, LIMITED, Tokyo (JP)

(72) Inventors: Tatsuaki Kasai, Osaka (JP); Nobuyuki Hatanaka, Osaka (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 21 days.

(21) Appl. No.: 15/215,764

(22) Filed: Jul. 21, 2016

(65) Prior Publication Data
US 2017/0022418 A1 Jan. 26, 2017

(30) Foreign Application Priority Data
Jul. 24, 2015 (JP) .............................. JP2015-147139

(51) Int. Cl.
| C09K 19/38 | (2006.01) |
| G02B 5/30 | (2006.01) |
| G06F 3/041 | (2006.01) |
| H01L 51/52 | (2006.01) |
| C09K 19/34 | (2006.01) |
| C09K 19/04 | (2006.01) |

(52) U.S. Cl.
CPC .......... *C09K 19/3838* (2013.01); *C09K 19/34* (2013.01); *G02B 5/3016* (2013.01); *G06F 3/041* (2013.01); *H01L 51/5284* (2013.01); *C09K 2019/0433* (2013.01); *C09K 2019/0448* (2013.01); *G06F 2203/04103* (2013.01)

(58) Field of Classification Search
CPC combination set(s) only.
See application file for complete search history.

(56) References Cited

U.S. PATENT DOCUMENTS

| 2004/0189909 | A1* | 9/2004 | Kashima | G02B 5/3016 349/117 |
| 2008/0213511 | A1* | 9/2008 | Ikeda | B32B 23/08 428/1.31 |
| 2010/0301271 | A1 | 12/2010 | Adlem et al. | |
| 2011/0057186 | A1* | 3/2011 | Yamazaki | H01L 27/1225 257/43 |
| 2012/0056129 | A1 | 3/2012 | Hasebe et al. | |
| 2012/0295071 | A1* | 11/2012 | Sato | G06F 3/041 428/188 |
| 2015/0108401 | A1* | 4/2015 | Hirai | C09K 19/32 252/299.4 |
| 2015/0146156 | A1* | 5/2015 | Hirai | C09K 19/56 349/183 |

FOREIGN PATENT DOCUMENTS

| CN | 1869779 A | 11/2006 |
| CN | 105093846 A | 11/2015 |
| JP | 10-147783 A | 6/1998 |
| JP | 2001-100028 A | 4/2001 |
| JP | 2009-98664 A | 5/2009 |
| JP | 2009-286976 A | 12/2009 |
| JP | 2010-237699 A | 10/2010 |
| JP | 2010-262098 A | 11/2010 |
| JP | 2010-537955 A | 12/2010 |
| JP | 2011-2556 A | 1/2011 |
| JP | 2011-79984 A | 4/2011 |
| JP | 2011-207765 A | 10/2011 |
| JP | 2012-21068 A | 2/2012 |
| JP | 2015-69157 A | 4/2015 |
| JP | 2015-110728 A | 6/2015 |

OTHER PUBLICATIONS

Japanese Office Action for Japanese Application No. 2016-145784, dated Nov. 27, 2018, with English translation.
Japanese Office Action, dated Apr. 2, 2019, for Japanese Application No. 2016-145784, with an English translation.
Chinese Office Action and Search Report for Chinese Application No. 201610586672.4, dated Jun. 30, 2020, with English translation of the Office Action.
Japanese Office Action, dated Apr. 7, 2020, for Japanese Application No. 2016-145784, with a partial English translation.
Ohwa, "Recent Aspects in Photoinitiators," Journal of Printing Science and Technology, The Japanese Society of Printing Science and Technology, 2003, vol. 40, No. 3, pp. 168-175 (total 34 pages), with an English translation.
Taiwanese Office Action and Search Report, dated Jan. 8, 2020, for Taiwanese Application No. 105123204, along with an English translation.
Japanese Office Action for Japanese Application No. 2019-120436, dated Jun. 9, 2020, with English translation.
Taiwanese Office Action and Search Report for Taiwanese Application No. 105123204, dated Jul. 27, 2020, with English translation.
Japanese Decision of Refusal for Japanese Application No. 2019-120436, dated Nov. 10, 2020, with an English translation.
Japanese Appeal Decision (including a partial English translation thereof) issued in the corresponding Japanese Patent Application No. 2016-145784 on Sep. 8, 2020.

* cited by examiner

*Primary Examiner* — Anthony J Frost
(74) *Attorney, Agent, or Firm* — Birch, Stewart, Kolasch & Birch, LLP

(57) ABSTRACT

Provided is (i) a composition containing at least one kind of polymerizable liquid crystal compound and at least one kind of photopolymerization initiator, the at least one kind of photopolymerization initiator having (i) a maximum absorption at wavelength $\lambda(A)$ and (ii) a maximum absorption at wavelength $\lambda(B)$, the at least one kind of polymerizable liquid crystal compound and the at least one kind of photopolymerization initiator satisfying the following: 20 nm<$\lambda(B)-\lambda_{max}(LC)$; or 20 nm<$\lambda_{max}(LC)-\lambda(A)$, wherein $\lambda_{max}(LC)$ represents a wavelength at which the at least one kind of polymerizable liquid crystal compound has a maximum absorption, the composition being a composition from which an optically anisotropic layer that hardly has a transfer defect during a transfer is capable of being produced, and (ii) a display device and the like each including the optically anisotropic layer produced from the composition.

6 Claims, No Drawings

COMPOSITION AND DISPLAY DEVICE

This Nonprovisional application claims priority under 35 U.S.C. § 119 on Patent Application No. 2015-147139 filed in Japan on Jul. 24, 2015, the entire contents of which are hereby incorporated by reference.

TECHNICAL FIELD

The present invention relates to (i) a composition from which an optically anisotropic layer is capable of being produced and (ii) a display device including an optically anisotropic layer.

BACKGROUND ART

A touch panel display device such as a flat panel display device (FPD) is composed of members each including an optical film, such as a polarizing plate and a wave plate. As such an optical film, there is known an optical film including a liquid crystal cured film (optically anisotropic layer) that is made from a composition which contains a polymerizable liquid crystal compound. Patent Literature 1 discloses an optical film including a liquid crystal cured film that exhibits reciprocal wavelength dispersibility.

CITATION LIST

Patent Literature

[Patent Literature 1]
Japanese Translation of PCT International Application Publication, Tokuhyo, No. 2010-537955

SUMMARY OF INVENTION

Technical Problem

An optically anisotropic layer, obtained by polymerizing a polymerizable liquid crystal compound, is used for a touch panel display device such that the optically anisotropic layer is transferred to a display element. Note, here, that the term "transfer" means (i) bonding an optically anisotropic layer, formed on a base material, to a transfer receiving body via an adhesive agent layer or the like and then (ii) removing the base material by peeling the base material off the optically anisotropic layer. Note also that the term "transfer receiving body" means a material to which an optically anisotropic layer is to be transferred.

However, a base material is not easily peeled off an optically anisotropic layer which is obtained by polymerizing a polymerizable liquid crystal compound having a maximum absorption at a wavelength in a vicinity of 300 nm to 380 nm. This may cause the optically anisotropic layer to have a transfer defect, e.g., may cause the optically anisotropic layer to (i) have a streak while being transferred to a transfer receiving body or (ii) be partially peeled together with the base material. That is, there is a problem that an optically anisotropic layer obtained by polymerizing such a polymerizable liquid crystal compound is not easily transferred to a transfer receiving body.

The present invention has been made in view of the above problem, and a main object of the present invention is to provide (i) a composition from which an optically anisotropic layer that hardly has a transfer defect during a transfer is capable of being produced and (ii) a display device and the like each including the optically anisotropic layer.

Solution to Problem

In order to attain the above object, the present invention includes the following inventions.

<1>
A composition comprising at least one kind of polymerizable liquid crystal compound and a photopolymerization initiator composition,
wherein the photopolymerization initiator composition comprises at least one kind of photopolymerization initiator,
the photopolymerization initiator composition has (i) a maximum absorption at wavelength $\lambda(A)$ and (ii) a maximum absorption at wavelength $\lambda(B)$, and
the at least one kind of polymerizable liquid crystal compound and the photopolymerization initiator composition satisfy the following:

$$20 \text{ nm} < \lambda(B) - \lambda_{max}(LC) \text{ or}$$

$$20 \text{ nm} < \lambda_{max}(LC) - \lambda(A),$$

wherein $\lambda_{max}(LC)$ represents a wavelength at which the at least one kind of polymerizable liquid crystal compound has a maximum absorption.

<2>
The composition as set forth in <1>, wherein the at least one kind of polymerizable liquid crystal compound satisfies the following:

$$300 \text{ nm} \leq \lambda_{max}(LC) \leq 380 \text{ nm}.$$

<3>
The composition as set forth in <1>, wherein the at least one kind of polymerizable liquid crystal compound and the photopolymerization initiator composition satisfy the following:

$$\lambda(A) < \lambda_{max}(LC) < \lambda(B).$$

<4>
The composition as set forth in <1>, wherein the at least one kind of photopolymerization initiator contained in the photopolymerization initiator composition has a maximum absorption at a wavelength in a range of 290 nm to 330 nm.

<5>
The composition as set forth in <1>, wherein the at least one kind of photopolymerization initiator contained in the photopolymerization initiator composition has a maximum absorption at a wavelength in a range of 340 nm to 380 nm.

<6>
The composition as set forth in <1>, wherein the photopolymerization initiator composition contains only one kind of photopolymerization initiator.

<7>
The composition as set forth in <1>, wherein the photopolymerization initiator composition contains only two kinds of photopolymerization initiators.

<8>
The composition as set forth in <1>, wherein the at least one kind of photopolymerization initiator which has a maximum absorption at a wavelength $\lambda_1$ is contained, in the photopolymerization initiator composition, in an amount of not less than 1 part by mass and not more than 20 parts by mass, relative to 100 parts by mass of the at least one kind of polymerizable liquid crystal compound,
the wavelength $\lambda_1$ satisfying the following Formula (II):

$$20 \text{ nm} < |\lambda_1 - \lambda_{max}(LC)| \tag{II}.$$

<9>

The composition as set forth in <1>, wherein the at least one kind of photopolymerization initiator contained in the photopolymerization initiator composition has an oxime structure in a molecule thereof.

<10>

An optically anisotropic layer produced from a composition recited in <1>.

<11>

The optically anisotropic layer as set forth in <10>, wherein the optically anisotropic layer has an optical characteristic represented by the following Formulae (1) and (2):

$$Re(450)/Re(550) \le 1.00 \quad (1)$$

$$1.00 \le Re(650)/Re(550) \quad (2)$$

wherein: Re(450) represents an in-plane phase difference value with respect to light having a wavelength of 450 nm; Re(550) represents an in-plane phase difference value with respect to light having a wavelength of 550 nm; and Re(650) represents an in-plane phase difference value with respect to light having a wavelength of 650 nm.

<12>

The optically anisotropic layer as set forth in <10>, wherein the optically anisotropic layer has an optical characteristic represented by the following Formula (3):

$$100 \text{ nm} < Re(550) < 160 \text{ nm} \quad (3)$$

wherein Re(550) represents an in-plane phase difference value with respect to light having a wavelength of 550 nm.

<13>

An optical film comprising an optically anisotropic layer recited in <10>.

<14>

A circularly polarizing plate comprising:
an optically anisotropic layer recited in <10>; and
a polarizing plate.

<15>

An organic electroluminescence display device comprising a circularly polarizing plate recited in <14>.

<16>

A touch panel display device comprising a circularly polarizing plate recited in <14>.

Advantageous Effects of Invention

According to the present invention, it is possible to provide (i) a composition from which an optically anisotropic layer that hardly has a transfer defect during a transfer is capable of being produced and (ii) display device and the like each including the optically anisotropic layer.

DESCRIPTION OF EMBODIMENTS

The following description will discuss, in detail, an embodiment of the present invention. Note that the phrase "A to B" as used herein means "not less than A and not more than B."

<Polymerizable Liquid Crystal Compound>

According to the present invention, a polymerizable liquid crystal compound contained in a composition is a compound that has a polymerizable group and has liquid crystallinity. The polymerizable group, which means a group that is involved in a polymerization reaction, is preferably a photopolymerizable group. Note here that the photopolymerizable group refers to a group that can be involved in a polymerization reaction by, for example, an active radical or an acid generated from a photopolymerization initiator.

Examples of the polymerizable group include a vinyl group, a vinyloxy group, a 1-chlorovinyl group, an isopropenyl group, a 4-vinylphenyl group, an acryloyloxy group, a methacryloyloxy group, an oxiranyl group, an oxetanyl group, and the like. Of these polymerizable groups, a vinyloxy group, an acryloyloxy group, a methacryloyloxy group, an oxiranyl group, and an oxetanyl group are preferable, and an acryloyloxy group is more preferable. The liquid crystallinity can be achieved by thermotropic liquid crystal or lyotropic liquid crystal, or by nematic liquid crystal or smectic liquid crystal of thermotropic liquid crystal. From the viewpoint of easiness of production, the liquid crystallinity is preferably achieved by nematic liquid crystal of thermotropic liquid crystal.

In terms of exhibition of reciprocal wavelength dispersibility (described earlier), the polymerizable liquid crystal compound is preferably a polymerizable liquid crystal compound having a structure represented by the following Formula (I):

$$L\text{-}G\text{-}D\text{-}Ar\text{-}D\text{-}G\text{-}L \quad (I)$$

where Ar represents a substituted or unsubstituted bivalent aromatic group. This aromatic group refers to a group which has planarity and a ring structure whose pi electron number is [4n+2] in accordance with Hückel rule where n represents an integer. In a case where the ring structure includes heteroatoms such as —N═ and —S—, (i) a non-covalently bonded electron pair on these heteroatoms and (ii) pi electrons in the ring structure satisfy the Hückel rule. Such a case also encompasses a case where the ring structure has aromaticity. The bivalent aromatic group preferably contains at least one atom selected from the group consisting of a nitrogen atom, an oxygen atom, and a sulfur atom.

Two Ds are each independently a single bond or a bivalent linking group.

Two Gs each independently represent a bivalent alicyclic hydrocarbon group.

Two Ls each independently represent a monovalent organic group, and at least one of the two Ls has a polymerizable group.

Ar preferably has at least one selected from a substituted or unsubstituted aromatic hydrocarbon ring, a substituted or unsubstituted heteroaromatic ring, and an electron-withdrawing group. The aromatic hydrocarbon ring, which is exemplified by a benzene ring, a naphthalene ring, an anthracene ring, and the like, is preferably a benzene ring or a naphthalene ring. Examples of the heteroaromatic ring include a furan ring, a benzofuran ring, a pyrrole ring, an indole ring, a thiophene ring, a benzothiophene ring, a pyridine ring, a pyrazine ring, a pyrimidine ring, a triazole ring, a triazine ring, a pyrroline ring, an imidazole ring, a pyrazole ring, a thiazole ring, a benzothiazole ring, a thienothiazole ring, an oxazole ring, a benzoxazole ring, a phenanthroline ring, and the like. Of these heteroaromatic rings, Ar preferably has a thiazole ring, a benzothiazole ring, or a benzofuran ring, and more preferably has a benzothiazole ring. In a case where Ar contains a nitrogen atom, the nitrogen atom preferably has a pi electron.

In Formula (I), a total number Nπ of pi electrons contained in the bivalent aromatic group represented by Ar is preferably not less than 8, more preferably not less than 10, still more preferably not less than 14, and particularly preferably not less than 16. Further, the total number Nπ is preferably not more than 30, more preferably not more than 26, and still more preferably not more than 24.
Examples of the aromatic group represented by Ar include the following groups:
[Chem. 1]
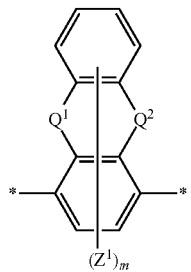
(Ar-1)
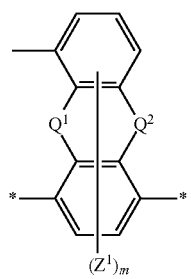
(Ar-2)
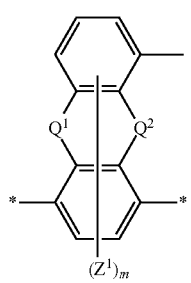
(Ar-3)
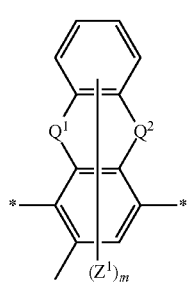
(Ar-4)
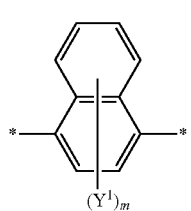
(Ar-5)
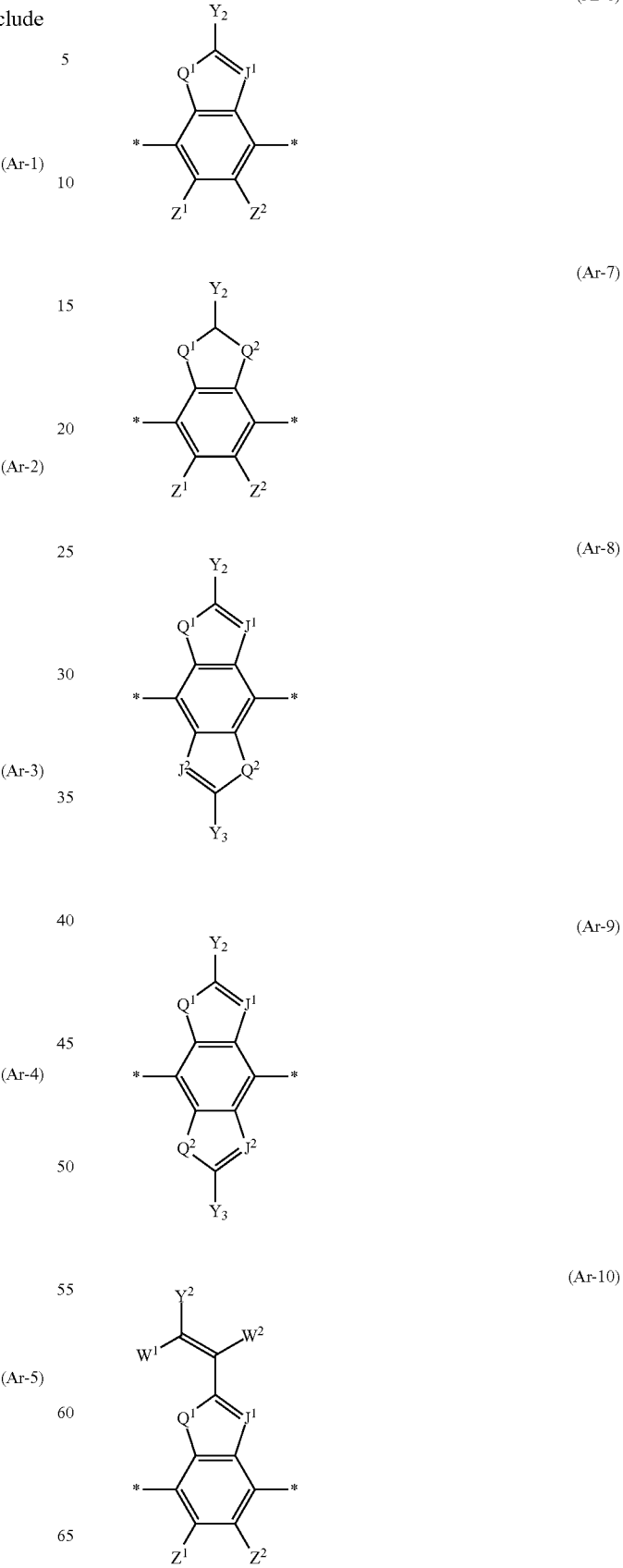

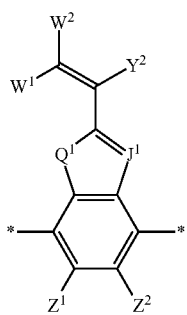 (Ar-11)
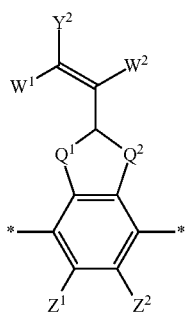 (Ar-12)
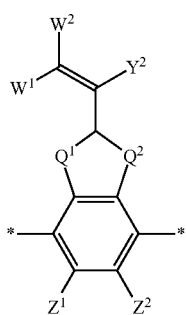 (Ar-13)
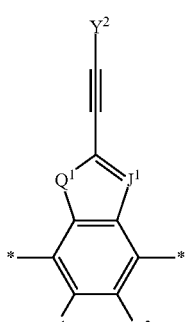 (Ar-14)
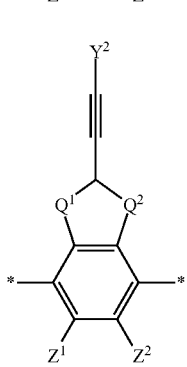 (Ar-15)
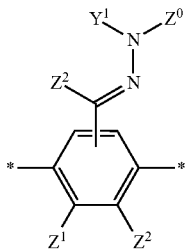 (Ar-16)
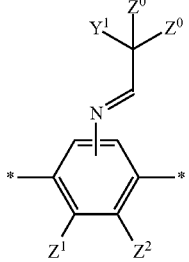 (Ar-17)
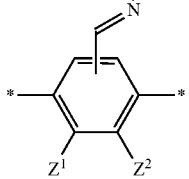 (Ar-18)
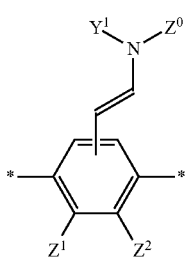 (Ar-19)
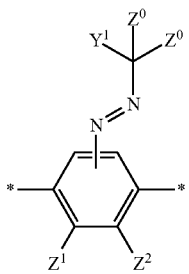 (Ar-20)
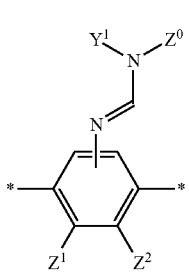 (Ar-21)

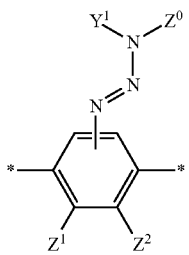
(Ar-22)

In Formulae (Ar-1) through (Ar-22), an asterisk* represents a connection, and $Z^0$, $Z^1$, and $Z^2$ each independently represent a hydrogen atom, a halogen atom, a C1-C12 alkyl group, a cyano group, a nitro group, a C1-C12 alkylsulfinyl group, a C1-C12 alkylsulfonyl group, a carboxyl group, a C1-C12 fluoroalkyl group, a C1-C6 alkoxy group, a C1-C12 alkylthio group, a C1-C12 N-alkylamino group, a C2-C12 N,N-dialkylamino group, a C1-C12 N-alkylsulfamoyl group, or a C2-C12 N,N-dialkylsulfamoyl group.

$Q^1$, $Q^2$, and $Q^3$ each independently represent —$CR^{2'}R^{3'}$—, —S—, —NH—, —$NR^{2'}$—, —CO—, or —O—, and $R^{2'}$ and $R^{3'}$ each independently represent a hydrogen atom or a C1-C4 alkyl group.

$J^1$ and $J^2$ each independently represent a carbon atom or a nitrogen atom.

$Y^1$, $Y^2$, and $Y^3$ each independently represent a substituted or unsubstituted aromatic hydrocarbon group or a substituted or unsubstituted heteroaromatic ring group.

$W^1$ and $W^2$ each independently represent a hydrogen atom, a cyano group, a methyl group, or a halogen atom, and m is an integer of 0 to 6.

Examples of the aromatic hydrocarbon group in $Y^1$, $Y^2$, and $Y^3$ include C6-C20 aromatic hydrocarbon groups such as a phenyl group, a naphthyl group, an anthryl group, a phenanthryl group, and a biphenyl group. Of these aromatic hydrocarbon groups, a phenyl group or a naphthyl group is preferable, and a phenyl group is more preferable. Examples of the heteroaromatic ring group in $Y^1$, $Y^2$, and $Y^3$ include C4-C20 heteroaromatic ring groups, each containing at least one heteroatom such as a nitrogen atom, an oxygen atom, or sulfur atom, such as a furyl group, a pyrrolyl group, a thienyl group, a pyridinyl group, a thiazolyl group, and benzothiazolyl group. Of these heteroaromatic ring groups, a furyl group, a thienyl group, a pyridinyl group, a thiazolyl group, or a benzothiazolyl group is preferable.

$Y^1$, $Y^2$, and $Y^3$ can be each independently a substituted or unsubstituted polycyclic aromatic hydrocarbon group or a substituted or unsubstituted polycyclic heteroaromatic ring group. A polycyclic aromatic hydrocarbon group refers to a condensed polycyclic aromatic hydrocarbon group or a group derived from an aromatic ring assembly. A polycyclic heteroaromatic ring group refers to a condensed polycyclic heteroaromatic ring group or a group derived from an aromatic ring assembly.

It is preferable that $Z^0$, $Z^1$, and $Z^2$ be each independently a hydrogen atom, a halogen atom, a C1-C6 alkyl group, a cyano group, a nitro group, or a C1-C12 alkoxy group. It is more preferable that $Z^0$ be a hydrogen atom, a C1-C12 alkyl group, or a cyano group. It is still more preferable that $Z^1$ and $Z^2$ be each a hydrogen atom, a fluorine atom, a chlorine atom, a methyl group, or a cyano group.

$Q^1$, $Q^2$, and $Q^3$ are each preferably —NH—, —S—, —$NR^{2'}$—, or —O—, and $R^{2'}$ is preferably a hydrogen atom.

Of —NH—, —S—, —$NR^{2'}$—, and —O—, —S—, —O—, or —NH— is particularly preferable.

Of Formulae (Ar-1) through (Ar-22), Formulae (Ar-6) and (Ar-7) are preferable from the viewpoint of molecular stability.

In Formulae (Ar-16) through (Ar-22), together with $Z^0$ and a nitrogen atom to which $Y^1$ is bound, $Y^1$ can form a heteroaromatic ring group. Examples of the heteroaromatic ring group, which is exemplified by the heteroaromatic rings (mentioned earlier), each of which Ar can have, include a pyrrole ring, an imidazole ring, a pyrroline ring, a pyridine ring, a pyrazine ring, a pyrimidine ring, an indole ring, a quinoline ring, an isoquinoline ring, a purine ring, a pyrrolidine ring, and the like. The heteroaromatic ring group can have a substituent. Further, together with $Z^0$ and a nitrogen atom to which $Y^1$ is bound, $Y^1$ can be a substituted or unsubstituted polycyclic aromatic hydrocarbon group (described earlier) or a substituted or unsubstituted polycyclic heteroaromatic ring group (described earlier). Examples of the substituted or unsubstituted polycyclic aromatic hydrocarbon group or the substituted or unsubstituted polycyclic heteroaromatic ring group include a benzofuran ring, a benzothiazole ring, a benzoxazole ring, and the like.

In a case where an optically anisotropic layer which is a liquid crystal cured film obtained by curing the composition satisfies an optical characteristic represented by the foregoing Formulae (1) and (2), the polymerizable liquid crystal compound is preferably a compound represented by the following Formula (A) (hereinafter also referred to as a compound (A)). Polymerizable liquid crystal compounds can be used in only one kind or in combination of two or more kinds. In a case where two or more kinds of polymerizable liquid crystal compounds are used in combination, at least one kind of the two or more kinds of polymerizable liquid crystal compounds is preferably the compound (A).

[Chem. 2]

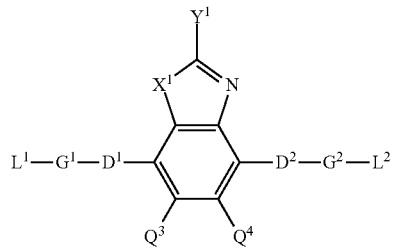

(A)

wherein: $X^1$ represents an oxygen atom, a sulfur atom, or —$NR^1$—; $R^1$ represents a hydrogen atom or a C1-C4 alkyl group; $Y^1$ represents a substituted or unsubstituted C6-C12 monovalent aromatic hydrocarbon group, or a substituted or unsubstituted C3-C12 monovalent aromatic heterocyclic group; $Q^3$ and $Q^4$ each independently represent a hydrogen atom, a substituted or unsubstituted C1-C20 monovalent aliphatic hydrocarbon group, a C3-C20 monovalent alicyclic hydrocarbon group, a substituted or unsubstituted C6-C20 monovalent aromatic hydrocarbon group, a halogen atom, a cyano group, a nitro group, —$NR^2R^3$, or —$SR^2$, or (i) $Q^3$ and (ii) $Q^4$, which are bound together, (iii) a carbon atom to which $Q^3$ is bound, and (iv) a carbon atom to which $Q^4$ is bound form an aromatic ring or a heteroaromatic ring; $R^2$ and $R^3$ each independently represent a hydrogen atom or a C1-C6 alkyl group; $D^1$ and $D^2$ each independently represent a single bond, —C(=O)—O—, —C(=S)—O—, —CR$^4$R$^5$—, —CR$^4$R$^5$—CR$^6$R$^7$—, —O—CR$^4$R$^5$—, —CR$^4$R$^5$—O—CR$^6$R$^7$—, —C(=O)—O—CR$^4$R$^5$—, —O—C(=O)—CR$^4$R$^5$—, —CR$^4$R$^5$—O—C(=O)—CR$^6$R$^7$—, —CR$^4$R$^5$—C(=O)—O—CR$^6$R$^7$—, —NR$^4$—CR$^5$R$^6$—, or —C(=O)—NR$^4$—; R$^4$, R$^5$, R$^6$, and R$^7$ each independently represent a hydrogen atom, a fluorine atom, or a C1-C4 alkyl group; G$^1$ and G$^2$ each independently represent a C5-C8 bivalent alicyclic hydrocarbon group whose methylene group can be replaced with an oxygen atom, a sulfur atom, or —NH— and whose methine group can be replaced with a tertiary nitrogen atom; and L$^1$ and L$^2$ each independently represent a monovalent organic group, and at least one of L$^1$ and L$^2$ has a polymerizable group. Note here that the polymerizable group is as described earlier.

L$^1$ in the compound (A) is preferably a group represented by the following Formula (A1), and L$^2$ in the compound (A) is preferably a group represented by the following Formula (A2).

$$P^1\text{-}F^1\text{-}(B^1\text{-}A^1)_k\text{-}E^1\text{-} \quad (A1)$$

$$P^2\text{-}F^2\text{-}(B^2\text{-}A^2)_l\text{-}E^2\text{-} \quad (A2)$$

wherein: B$^1$, B$^2$, E$^1$, and E$^2$ each independently represent —CR$^4$R$^5$—, —CH$_2$—CH$_2$—, —O—, —S—, —C(=O)—O—, —O—C(=O)—O—, —CS—O—, —O—C(=S)—O—, —C(=O)—NR$^1$—, —O—CH$_2$—, —S—CH$_2$—, or a single bond; A$^1$ and A$^2$ each independently represent a C5-C8 bivalent alicyclic hydrocarbon group whose methylene group can be replaced with an oxygen atom, a sulfur atom, or —NH— and whose methine group can be replaced with a tertiary nitrogen atom, or a C6-C18 bivalent aromatic hydrocarbon group; k and l each independently represent an integer of 0 to 3; F$^1$ and F$^2$ each independently represent a C1-C12 bivalent aliphatic hydrocarbon group; P$^1$ represents a hydrogen atom or a polymerizable group, and is preferably a polymerizable group; P$^2$ represents a hydrogen atom or a polymerizable group; at least one of P$^1$ and P$^2$ only needs to be a polymerizable group; R$^4$ and R$^5$ each independently represent a hydrogen atom, a fluorine atom, or a C1-C4 alkyl group; and R$^1$ represents a hydrogen atom or a C1-C4 alkyl group.

Preferable examples of the compound (A) include a polymerizable liquid crystal compound disclosed in Published Japanese Translation of PCT International Application, Tokuhyo, No. 2011-207765.

Examples of a polymerizable liquid crystal compound that differs from the compound (A) include a compound that contains a group represented by the following Formula (X) (hereinafter also referred to as a compound (X)):

$$P^{11}\text{-}B^{11}\text{-}E^{11}\text{-}B^{12}\text{-}A^{11}\text{-}B^{13}\text{-} \quad (X)$$

wherein: P$^{11}$ represents a polymerizable group; A$^{11}$ represents a bivalent alicyclic hydrocarbon group or a bivalent aromatic hydrocarbon group, the bivalent alicyclic hydrocarbon group and the bivalent aromatic hydrocarbon group each contain a hydrogen atom that can be replaced with a halogen atom, a C1-C6 alkyl group, a C1-C6 alkoxy group, a cyano group, or a nitro group, and the C1-C6 alkyl group and the C1-C6 alkoxy group each contain a hydrogen atom that can be replaced with a fluorine atom; B$^{11}$ represents —O—, —S—, —C(=O)—O—, —O—C(=O)—, —O—C(=O)—O—, —C(=O)—NR$^{16}$—, —NR$^{16}$—C(=O)—, —C(=O)—, —CS—, or a single bond; R$^{16}$ represents a hydrogen atom or a C1-C6 alkyl group; B$^{12}$ and B$^{13}$ each independently represent —CH=CH—, —CH$_2$—CH$_2$—, —O—, —S—, —C(=O)—, —C(=O)—O—, —O—C(=O)—, —O—C(=O)—O—, —CH=N—, —N=CH—, —N=N—, —C(=O)—NR$^{16}$—, —NR$^{16}$—C(=O)—, —OCH$_2$—, —OCF$_2$—, —CH$_2$O—, —CH=CH—C(=O)—O—, —O—C(=O)—CH=CH—, or a single bond; and E$^{11}$ represents a C1-C12 alkanediyl group whose hydrogen atom can be replaced with a C1-C5 alkoxy group whose hydrogen atom can be replaced with a halogen atom, and the C1-C12 alkanediyl group has —CH$_2$— that can be replaced with —O— or Specific examples of the polymerizable liquid crystal compound include: a polymerizable group-containing compound of compounds listed in "3.8.6 *Nettowa-ku* [Network] (*Kannzenn kakyou-gata* [Perfectly crosslinked type])" and "6.5.1 *Ekisyou zairyou* [Liquid crystal material] b. *Jyuugousei nematikku ekisyou zairyou* [Polymerizable nematic liquid crystal material]" of *Ekisyou binnrann* [Handbook of liquid crystals] (edited by Ekisyou binnrann hennsyuu iinnkai [Editorial committee of handbook of liquid crystals], published by MARUZEN Co., Ltd. on Oct. 30, 2000); polymerizable liquid crystal compounds disclosed in Japanese Patent Application Publication, Tokukai, No. 2010-31223, Japanese Patent Application Publication, Tokukai, No. 2010-270108, Japanese Patent Application Publication, Tokukai, No. 2011-6360, and Japanese Patent Application Publication, Tokukai, No. 2011-207765; and the like.

An amount in which the polymerizable liquid crystal compound is contained in 100 parts by mass of a solid content of the composition is normally 70 parts by mass to 99.5 parts by mass, preferably 80 parts by mass to 99 parts by mass, and more preferably 80 parts by mass to 94 parts by mass. In a case where the amount falls within the above range, the optically anisotropic layer to be obtained tends to be high in alignment. Note, here, that the term "solid content" refers to a total amount of components, other than a solvent, of the composition.

<Photopolymerization Initiator>

The photopolymerization initiator is more preferably a photopolymerization initiator that generates a radical by photoirradiation.

Examples of the photopolymerization initiator include a benzoin compound, a benzophenone compound, a benzil ketal compound, an α-hydroxyketone compound, an α-amino ketone compound, a triazine compound, an iodonium salt, and a sulfonium salt. Specific examples of the polymerization initiator include: Irgacure (Registered Trademark) 907, Irgacure 184, Irgacure 651, Irgacure 819, Irgacure 250, Irgacure 369, Irgacure 379, Irgacure 127, Irgacure 2959, Irgacure 754, and Irgacure 379EG (each manufactured by BASF Japan Ltd.); SEIKUOL BZ, SEIKUOL Z, and SEIKUOL BEE (each manufactured by Seiko Chemical Co., Ltd.); Kayacure BP100 (manufactured by Nippon Kayaku Co., Ltd.); Kayacure UVI-6992 (manufactured by The Dow Chemical Company); ADEKA OPTOMER SP-152, ADEKA OPTOMER SP-170, ADEKA OPTOMER N-1717, ADEKA OPTOMER N-1919, ADEKA ARKLS NCI-831, and ADEKA ARKLS NCI-930 (each manufactured by ADEKA CORPORATION); TAZ-A and TAZ-PP (each manufactured by NIHON SIBER HEGNER K.K.); and TAZ-104 (manufactured by SANWA CHEMICAL CO., LTD.).

According to the present invention, a photopolymerization initiator composition is used. The photopolymerization initiator composition can contain only one kind of photopolymerization initiator or two or more kinds of photopolymerization initiators. In order to efficiently use light having a wavelength of less than 350 nm and light having a wavelength of not less than 350 nm, it is preferable that the photopolymerization initiator composition of the present invention contain two or more kinds of photopolymerization initiators that differ from each other in main photosensitive wavelength.

As a photopolymerization initiator that can efficiently use light having a wavelength of less than 350 nm, an α-acetophenone compound is preferably used. Examples of the α-acetophenone compound include 2-methyl-2-morpholino-1-(4-methylsulfanilphenyl)propane-1-one, 2-dimethylamino-1-(4-morpholinophenyl)-2-benzil butane-1-one, 2-dimethylamino-1-(4-morpholinophenyl)-2-(4-methylphenylmethyl)butane-1-one, and the like. More preferable examples of the α-acetophenone compound include 2-methyl-2-morpholino-1-(4-methylsulfanilphenyl)propane-1-one and 2-dimethylamino-1-(4-morpholinophenyl)-2-benzil butane-1-one. Examples of commercially-available products of the α-acetophenone compound include Irgacure 369, Irgacure 379EG, and Irgacure 907 (each manufactured by BASF Japan Ltd.), SEIKUOL BEE (manufactured by Seiko Chemical Co., Ltd.), and the like.

From the viewpoint that a polymerization reaction that occurs in a deep part of the optically anisotropic layer is more efficiently progressed, a photopolymerization initiator that can efficiently use light having a wavelength of not less than 350 nm is preferably used. For example, it is possible to use a photopolymerization initiator that has an absorbance of not less than 0.10, with respect to light having a wavelength of 350 nm, in 100 mL of a chloroform solution containing 1 (one) mg of the photopolymerization initiator. As the photopolymerization initiator that can efficiently use light having a wavelength of not less than 350 nm, a triazine compound or an oxime ester carbazole compound is preferable, and an oxime ester carbazole compound is more preferable from the viewpoint of sensitivity. Example of the oxime ester carbazole compound include 1,2-octanedione, 1-[4-(phenylthio)-2-(O-benzoyloxime)], ethanone, 1-[9-ethyl-6-(2-methylbenzoyl)-9H-carbazole-3-yl]-1-(O-acetyloxime), and the like. Examples of commercially-available products of the oxime ester carbazole compound include Irgacure OXE-01, Irgacure OXE-02, and Irgacure OXE-03 (each manufactured by BASF Japan Ltd.), ADEKA OPTOMER N-1919 and ADEKA ARKLS NCI-831 (each manufactured by ADEKA CORPORATION), and the like.

From the viewpoint that a polymerization reaction is more efficiently progressed, the photopolymerization initiator preferably has two or more maximum absorptions at wavelengths of not less than 300 nm. Examples of the photopolymerization initiator which has two or more maximum absorptions at wavelengths of not less than 300 nm include ADEKA ARKLS NCI-831 (manufactured by ADEKA CORPORATION), Irgacure OXE-03 (manufactured by BASF Japan Ltd.), and the like.

According to the composition in accordance with the present invention, the photopolymerization initiator composition preferably contains only one kind of photopolymerization initiator or only two kinds of photopolymerization initiators. Furthermore, at least one kind of photopolymerization initiator more preferably has a maximum absorption at a wavelength in a range of 290 nm to 330 nm or a maximum absorption at a wavelength in a range of 340 nm to 380 nm. Moreover, at least one kind of photopolymerization initiator preferably has an oxime structure in a molecule thereof.

The composition in accordance with the present invention contains: at least one kind of polymerizable liquid crystal compound; and a photopolymerization initiator composition containing at least one kind of photopolymerization initiator. The photopolymerization initiator composition has two maximum absorptions at wavelength $\lambda(A)$ and wavelength $\lambda(B)$. The at least one kind of polymerizable liquid crystal compound and the photopolymerization initiator composition satisfy the following formula:

$$\lambda(A) < \lambda(B);$$

$$20 \text{ nm} < \lambda(B) - \lambda_{max}(LC); \text{ or}$$

$$20 \text{ nm} < \lambda_{max}(LC) - \lambda(A),$$

wherein $\lambda_{max}(LC)$ represents a wavelength at which the at least one kind of polymerizable liquid crystal compound has a maximum absorption.

In a case where the photopolymerization initiator composition and the polymerizable liquid crystal compound satisfy the above formula, when the photopolymerization initiator and the polymerizable liquid crystal compound are each irradiated with light, the photopolymerization initiator absorbs light without being blocked by light absorption by the polymerizable liquid crystal compound, so that a radical is generated in an amount large enough for a polymerization reaction to be initiated. This makes it possible to suitably carry out the polymerization reaction. Note that it is possible to use, as the photopolymerization initiator, another photopolymerization initiator in addition to the photopolymerization initiator composition. The another photopolymerization initiator refers to a photopolymerization initiator such that a maximum absorption at wavelength thereof and the maximum absorption at wavelength $\lambda_{max}(LC)$ of the polymerizable liquid crystal compound do not satisfy the above formula.

The photopolymerization initiator composition which satisfies the above formula is added in an amount normally of 0.1 parts by mass to 30 parts by mass, preferably of 1 part by mass to 20 parts by mass, and more preferably of 3 parts by mass to 18 parts by mass, relative to 100 parts by mass of the polymerizable liquid crystal compound. The photopolymerization initiator which is contained in the photopolymerization initiator composition and which has at least one maximum absorption at wavelength $\lambda_1$ satisfying the following Formula (II) is added in an amount preferably of 1 part by mass to 20 parts by mass, and more preferably of 3 parts by mass to 18 parts by mass, relative to 100 parts by mass of the polymerizable liquid crystal compound.

$$20 \text{ nm} < |\lambda_1 - \lambda_{max}(LC)| \quad \text{(II)}$$

In the photopolymerization initiator composition, the photopolymerization initiator which has a maximum absorption at a wavelength satisfying Formula (II) is contained in an amount preferably of not less than 0.1 mass %, more preferably of not less than 1 mass %, and still more preferably of not less than 2 mass %, and most preferably not less than 2.5 mass %, and also preferably of not more than 18 mass %, and more preferably of not more than 14 mass %, relative to a total amount of the polymerizable liquid crystal compound and the photopolymerization initiator composition. The photopolymerization initiator composition which contains the photopolymerization initiator in an amount falling within the above range is less likely to disturb alignment of the polymerizable liquid crystal compound, and allows the optically anisotropic layer not to have a defect during a transfer.

Furthermore, in the photopolymerization initiator composition, the photopolymerization initiator which has a maximum absorption at a wavelength satisfying Formula (II) is contained in an amount of not less than 10 mass %, more preferably of not less than 15 mass %, still more preferably of not less than 16 mass %, relative to a total amount of the photopolymerization initiator composition. The photopolymerization initiator composition which contains the photopolymerization initiator in an amount falling within the above range is less likely to disturb alignment of the polymerizable liquid crystal compound, and allows the optically anisotropic layer not to have a defect during a transfer.

Note here that in a case where two or more kinds of polymerizable liquid crystal compounds are contained in the composition in accordance with the present invention, $\lambda_{max}$(LC) of a polymerizable liquid crystal compound that is most contained in a mass unit preferably satisfies the above formula. More preferably, $\lambda_{max}$(LC) of each of all the polymerizable liquid crystal compounds contained satisfies the above formula.

More preferably, $\lambda_{max}$(LC) further satisfies the following formula:

$$300 \text{ nm} \leq \lambda_{max}(LC) \leq 380 \text{ nm}.$$

Still more preferably, $\lambda_{max}$(LC) further satisfies the following formula:

$$\lambda(A) < \lambda_{max}(LC) < \lambda(B).$$

The composition in accordance with the present invention can further contain a component such as a solvent, a sensitizer, a polymerization inhibitor, and a leveling agent.

<Solvent>

The solvent is preferably a solvent that allows the polymerizable liquid crystal compound to be perfectly dissolved. Further, the solvent is preferably a solvent that is inactive in a polymerization reaction of the polymerizable liquid crystal compound.

Examples of the solvent include: alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; chlorine-containing solvents such as chloroform and chlorobenzene; and the like. These solvents can be used in only one kind or in combination of two or more kinds.

An amount in which the solvent is contained in 100 parts by mass of the composition is preferably 50 parts by mass to 98 parts by mass. Thus, a solid content of 100 parts by mass of the composition is preferably 2 parts by mass to 50 parts by mass. The solid content of the composition which solid content is not more than 50 parts by mass causes the composition to be less viscous, so that the optically anisotropic layer tends to be substantially uniform in thickness and less likely to be uneven. The solid content can be appropriately determined in view of a thickness of the optically anisotropic layer to be produced.

<Sensitizer>

Use of the sensitizer makes it possible to further promote a polymerization reaction of the polymerizable liquid crystal compound.

The sensitizer is preferably a photosensitizer. Examples of the sensitizer include: xanthone compounds such as xanthone and thioxanthone (e.g., 2,4-diethyl thioxanthone, 2-isopropyl thioxanthone, etc.); anthracene compounds such as anthracene and alkoxy group-containing anthracene (e.g., dibutoxyanthracene); phenothiazine; rubrene; and the like.

The sensitizer is contained, in the composition, in an amount preferably of 0.1 parts by mass to 30 parts by mass, more preferably of 0.5 parts by mass to 10 parts by mass, and still more preferably of 0.5 parts by mass to 8 parts by mass, relative to 100 parts by mass of the polymerizable liquid crystal compound.

<Polymerization Inhibitor>

Use of the polymerization inhibitor makes it possible to control a degree of progress of the polymerization reaction of the polymerizable liquid crystal compound.

The polymerization inhibitor is exemplified by radical capture agents such as (i) phenolic compounds such as 2,6-di-tert-butyl-4-methylphenol, (ii) sulfuric compounds such as dilauryl thiodipropionate, (iii) phosphorous compounds such as trioctyl phosphite, (iv) hindered amine structure-containing amine compounds typified by 2,2,6,6-tetramethylpiperidine, and (v) the like.

From the viewpoint that the optically anisotropic layer which is a liquid crystal cured film is less colored, a phenolic compound is preferable as the polymerization inhibitor.

The polymerization inhibitor is contained, in the composition, in an amount preferably of 0.1 parts by mass to 30 parts by mass, more preferably of 0.5 parts by mass to 10 parts by mass, and still more preferably of 0.5 parts by mass to 8 parts by mass, relative to 100 parts by mass of the polymerizable liquid crystal compound. In a case where the amount falls within the above range, it is possible to polymerize the polymerizable liquid crystal compound without disturbing alignment of the polymerizable liquid crystal compound. Polymerization inhibitors can be used in only one kind or in combination of two or more kinds.

<Leveling Agent>

The leveling agent, which is an additive that has a function of adjusting fluidity of a composition so as to further level a film to be obtained by application of the composition, is exemplified by a surfactant. Preferable examples of the leveling agent include: a leveling agent whose main component is a polyacrylate compound, such as "BYK-361N" (manufactured by BYK Chemie); and a leveling agent whose main component is a fluorine atom-containing compound, such as Surflon (Registered Trademark) "S-381" (manufactured by AGC SEIMI CHEMICAL CO., LTD.).

The leveling agent is contained, in the composition, in an amount preferably of 0.01 parts by mass to 5 parts by mass, and more preferably of 0.1 parts by mass to 3 parts by mass, relative to 100 parts by mass of the polymerizable liquid crystal compound. In a case where the amount falls within the above range, it is easy to parallelly align the polymerizable liquid crystal compound, and the optically anisotropic layer to be obtained becomes flatter and smoother. The composition can contain two or more kinds of leveling agents.

<Optically Anisotropic Layer>

The optically anisotropic layer in accordance with the present invention is made up of a liquid crystal cured film which is obtained by curing the composition. That is, the optically anisotropic layer is made from the composition. The optically anisotropic layer is usually obtained by (i) applying the composition, containing the polymerizable liquid crystal compound, to the base material or an alignment film formed on the base material and (ii) polymerizing the polymerizable liquid crystal compound.

Usually, the optically anisotropic layer is a film obtained by curing the composition in a state where the polymerizable liquid crystal compound is aligned, and has a thickness of not more than 5 µm. The optically anisotropic layer is preferably a liquid crystal cured film obtained by curing the composition in a state where the polymerizable liquid crystal compound is aligned in a direction parallel to or perpendicular to a surface of the base material.

The thickness of the optically anisotropic layer is preferably 0.5 µm to 5 µm, more preferably 1 (one) µm to 3 µm. The thickness of the optically anisotropic layer can be measured with use of an interference thickness meter, a laser microscope, or a stylus type thickness meter.

The optically anisotropic layer, obtained by curing the composition in the state where the polymerizable liquid crystal compound is aligned in the direction parallel to the surface of the base material, preferably has the following birefringence $\Delta n(\lambda)$ with respect to light having a wavelength of $\lambda$ nm. That is, the birefringence $\Delta n(\lambda)$ preferably satisfies an optical characteristic represented by the following Formulae (1) and (2), more preferably satisfies an optical characteristic represented by the following Formulae (1), (2), and (3):

$$Re(450)/Re(550) \leq 1.00 \tag{1}$$

$$1.00 \leq Re(650)/Re(550) \tag{2}$$

wherein: $Re(450)$ represents an in-plane phase difference value with respect to light having a wavelength of 450 nm; $Re(550)$ represents an in-plane phase difference value with respect to light having a wavelength of 550 nm; and $Re(650)$ represents an in-plane phase difference value with respect to light having a wavelength of 650 nm.

$$100 \text{ nm} < Re(550) < 160 \text{ nm} \tag{3}$$

wherein $Re(550)$ represents an in-plane phase difference value with respect to light having a wavelength of 550 nm.

For the purpose of protecting an element of a liquid crystal display device or an EL display device from a ultraviolet ray, the optically anisotropic layer in accordance with the present invention preferably absorbs light having a wavelength in a range of 300 nm to 380 nm, more preferably absorbs light having a wavelength in a range of 330 nm to 380 nm, each of which light may cause a deterioration of the element. Furthermore, the optically anisotropic layer more preferably has a maximum absorption at a wavelength in a range of 300 nm to 380 nm. That is, the optically anisotropic layer in accordance with the present invention is preferably made from the polymerizable liquid crystal compound having a maximum absorption at a wavelength in a range of 300 nm to 380 nm, more preferably made from the polymerizable liquid crystal compound having a maximum absorption at a wavelength in a range of 330 nm to 380 nm.

Examples of the polymerizable liquid crystal compound having a maximum absorption at a wavelength in a range of 300 nm to 380 nm include the foregoing compound (A).

The optically anisotropic layer, obtained by curing the composition in the state where the polymerizable liquid crystal compound is aligned in the direction perpendicular to the surface of the base material, preferably satisfies the following Formula (4):

$$nz > nx \approx ny \tag{4}$$

wherein: nz represents a refractive index measured in a thickness direction of the optically anisotropic layer; nx represents the highest refractive index of refractive indices measured in an in-plane direction of the optically anisotropic layer; and ny represents an in-plane refractive index measured in a direction of optically anisotropic layer which direction is perpendicular to the in-plane direction, in which nx is measured.

The in-plane phase difference value of the optically anisotropic layer can be controlled by adjusting the thickness of the optically anisotropic layer. The in-plane phase difference value is determined by the following Formula (5). Therefore, it is only necessary to adjust $\Delta n(\lambda)$ and the thickness "d" in order to obtain a desired in-plane phase difference value ($Re(\lambda)$).

$$Re(\lambda) = d \times \Delta n(\lambda) \tag{5}$$

wherein: $Re(\lambda)$ represents an in-plane phase difference value at a wavelength of $\lambda$ nm; "d" represents a thickness; and $\Delta n(\lambda)$ represents a birefringence at the wavelength of $\lambda$ nm).

The birefringence $\Delta n(\lambda)$ is obtained by (i) measuring the in-plane phase difference value and (ii) dividing the in-plane phase difference value by the thickness of the optically anisotropic layer. Note, here, that it is possible to measure a substantial characteristic of the optically anisotropic layer by measuring the optically anisotropic layer formed on the base material, such as a glass substrate, which does not have an in-plane phase difference by itself. A specific measurement method will be later described in Examples.

In a case of the optically anisotropic layer obtained by curing the composition in the state where the polymerizable liquid crystal compound is aligned in the direction perpendicular to the surface of the base material, $Re(550)$ is preferably 0 (zero) nm to 10 nm, more preferably 0 (zero) nm to 5 nm. A phase difference value Rth in the thickness direction is preferably −10 nm to −300 nm, more preferably −20 nm to −200 nm. The optically anisotropic layer which satisfies Formula (4) and which has $Re(550)$ and Rth in the respective foregoing ranges is particularly suitable for compensation for an in-plane switching (IPS) mode liquid crystal display device.

Rth can be calculated from (i) a phase difference value $R_{40}$ which is measured by inclining a plane of the optically anisotropic layer by 40 degrees to an in-plane fast axis which is assumed to be an inclined axis and (ii) an in-plane phase difference value $R_0$. That is, Rth can be calculated by (a) calculating nx, ny, and nz by the following Formulae (9) through (11) from (i) the in-plane phase difference value $R_0$, (ii) the phase difference value $R_{40}$ which is measured by inclining the plane of the optically anisotropic layer by 40 degrees to the in-plane fast axis which is assumed to be an inclined axis, (iii) the thickness "d" of the optically anisotropic layer, and (iv) an average refractive index no of the optically anisotropic layer and (b) substituting nx, ny, and nz thus obtained into Formula (8).

$$Rth = [(nx+ny)/2 - nz] \times d \tag{8}$$

$$R_0 = (nx - ny) \times d \tag{9}$$

$$R_{40} = (nx - ny') \times d/\cos(\varphi) \tag{10}$$

$$(nx+ny+nz)/3 = n_0 \tag{11}$$

wherein:

$$\Phi = \sin^{-1}[\sin(40°)/n_0]$$

$$ny' = ny \times nz/[ny^2 \times \sin^2(\varphi) + nz^2 \times \cos^2(\varphi)]^{1/2}$$

<Base Material>

The base material, which is exemplified by a glass base material and a plastic base material, is preferably a plastic base material. Examples of plastic of which the plastic base material is made include plastics such as polyolefins such as polyethylene, polypropylene, and a norbornene polymer; cyclic olefinic resins; polyvinyl alcohol; polyethylene terephthalate; polymethacrylic acid ester; polyacrylic ester; cellulose esters such as triacetyl cellulose, diacetyl cellulose, and cellulose acetate propionate; polyethylene naphthalate; polycarbonate; polysulfone; polyether sulfone; polyether ketone; polyphenylene sulfide and polyphenylene oxide; and the like.

Examples of a commercially-available cellulose ester base material include: "Fuji TAC film" (manufactured by FujiFilm Corporation); "KC8UX2M", "KC8UY", and "KC4UY" (each manufactured by KONICA MINOLTA JAPAN, INC.); and the like.

Examples of commercially-available cyclic olefinic resins include "Topas" (Registered Trademark) (manufactured by Ticona (Germany)), "ARTON" (Registered Trademark) (manufactured by JSR Corporation), "ZEONOR" (Registered Trademark) and "ZEONEX" (Registered Trademark) (each manufactured by Zeon Corporation), and "APEL" (Registered Trademark) (manufactured by Mitsui Chemicals, Inc.). Such a cyclic olefinic resin can be made into the base material by film formation by publicly-known means such as a solvent cast method or a melt extrusion method. It is also possible to use a commercially-available cyclic olefinic resin base material. The commercially-available cyclic olefinic resin base material is exemplified by "Esushina" (Registered Trademark) and "SCA40" (Registered Trademark) (each manufactured by SEKISUI CHEMICAL CO., LTD.), "ZEONOR FILM" (Registered Trademark) (manufactured by Optes Co., Ltd.), and "ARTON FILM" (Registered Trademark) (manufactured by JSR Corporation).

The base material preferably has a small thickness in that the base material which is thin has a small mass (is light) and thus can be practically treated (is easy to industrially treat). Note, however, that the base material which has a too small thickness tends to be lower in strength and inferior in processability. The base material has a thickness normally of 5 µm to 300 µm and preferably of 20 µm to 200 µm.

<Alignment Film>

The alignment film is a film that has an alignment regulating force by which the polymerizable liquid crystal compound is subjected to liquid crystal alignment in a desired direction. The alignment film has a thickness of not more than 500 nm. The alignment film is exemplified by an alignment film made of an alignment polymer, a photoalignment film, and a groove alignment film.

The alignment film facilitates liquid crystal alignment of the polymerizable liquid crystal compound. States of liquid crystal alignment such as parallel alignment, perpendicular alignment, hybrid alignment, and tilt alignment change in accordance with a property of the alignment film and a property of the polymerizable liquid crystal compound, and it is optionally selectable how to combine the above states. In a case where the alignment film is a material that serves as the alignment regulating force by which to cause parallel alignment, the polymerizable liquid crystal compound can be subjected to parallel alignment or hybrid alignment. In a case where the alignment film is a material that serves as the alignment regulating force by which to cause perpendicular alignment, the polymerizable liquid crystal compound can be subjected to perpendicular alignment or tilt alignment.

Assuming that a plane of the optically anisotropic layer is a reference, the expressions such as "parallel" and "perpendicular" each refer to a direction in which a long axis of the polymerizable liquid crystal compound aligned extends. Parallel alignment refers to alignment such that the polymerizable liquid crystal compound aligned has a long axis that extends in a direction parallel to the plane of the optically anisotropic layer. The term "parallel" herein means an angle of 0°±20° with respect to the plane of the optically anisotropic layer. Perpendicular alignment refers to alignment such that the polymerizable liquid crystal compound aligned has a long axis that extends in a direction perpendicular to the plane of the optically anisotropic layer. The term "perpendicular" herein means an angle of 90°±20° with respect to the plane of the optically anisotropic layer.

In a case where the alignment film is made of an alignment polymer, the alignment regulating force can be optionally adjusted in accordance with a state of a surface of the alignment polymer and/or a rubbing condition. In a case where the alignment film is made of a photoalignment polymer, the alignment regulating force can be optionally adjusted in accordance with, for example, a condition under which to irradiate the photoalignment polymer with polarized light. Liquid crystal alignment of the polymerizable liquid crystal compound can also be controlled by selecting physical properties of the polymerizable liquid crystal compound, such as surface tension and liquid crystallinity.

In a case where the optically anisotropic layer satisfies Formula (4), liquid crystal alignment of the polymerizable liquid crystal compound from which the optically anisotropic layer is made is preferably perpendicular alignment. In order to perpendicularly align the polymerizable liquid crystal compound, it is preferable to use an alignment film that has a nonpolar substituent containing, for example, a silicon atom and a fluorine atom. As such an alignment film, it is possible to use a material that is generally used as a liquid crystal alignment film of a perpendicular alignment liquid crystal display element and is exemplified by materials disclosed in Japanese Patent No. 4605016, Japanese Patent No. 4985906, Japanese Patent No. 4502119, and International Publication No. WO2008/117760.

The alignment film that is provided between the base material and the optically anisotropic layer is preferably a film that is insoluble in a solvent to be used to provide the optically anisotropic layer on the alignment film and is resistant to heat during a heat treatment for removal of the solvent and liquid crystal alignment. The alignment film is exemplified by an alignment film made of an alignment polymer, a photoalignment film, a groove alignment film, and the like.

The alignment film has a thickness normally of 10 nm to 500 nm and preferably of 10 nm to 200 nm.

<Alignment Film Made of Alignment Polymer>

An alignment film made of an alignment polymer is normally obtained by applying, to a base material, a composition in which an alignment polymer is dissolved in a solvent (hereinafter also referred to as an alignment polymer composition), and removing the solvent, or by applying the alignment polymer composition to the base material, removing the solvent, and carrying out rubbing (a rubbing method).

The alignment polymer contained in the alignment polymer composition only needs to have a concentration falling within a range that allows material(s) of the alignment polymer to be completely dissolved in the solvent. The concentration is preferably 0.1 mass % to 20 mass %, and more preferably 0.1 mass % to 10 mass % in solid content terms, relative to the solution.

A commercially-available alignment polymer composition is exemplified by, for example, SUNEVER (Registered Trademark) (manufactured by NISSAN CHEMICAL INDUSTRIES, LTD.) and OPTMER (Registered Trademark) (manufactured by JSR Corporation).

[Photoalignment Film]

A photoalignment film is normally obtained by applying, to a base material, a composition containing a photoreactive group-containing polymer (photoalignment material) or a photoreactive group-containing monomer (photoalignment material) and a solvent (hereinafter also referred to as a composition for photoalignment film formation), and irradiating, with polarized light (preferably polarized UV), the base material to which the composition has been applied. The photoalignment film is more preferable in that a direction of the alignment regulating force can be optionally controlled by selecting a direction of polarized light with which to irradiate the base material to which the composition has been applied.

A photoreactive group refers to a group that generates liquid crystal alignment power by light irradiation. Specifically, a photoreactive group is a group that causes a photoreaction in which liquid crystal alignment power originates, such as molecular alignment induction or a molecular isomerization reaction caused by light irradiation, a dimerization reaction caused by light irradiation, a photocrosslinking reaction caused by light irradiation, or a photolysis reaction caused by light irradiation. In particular, a photoreactive group that causes a dimerization reaction or a photocrosslinking reaction is preferable in terms of excellence in alignment property. As a photoreactive group that can cause the above reaction, a group that has an unsaturated bond, particularly a double bond is preferable, and a group that has at least one bond selected from the group consisting of a carbon-carbon double bond (C=C bond), a carbon-nitrogen double bond (C=N bond), a nitrogen-nitrogen double bond (N=N bond), and a carbon-oxygen double bond (C=O bond) is particularly preferable.

The photoreactive group-containing polymer or the photoreactive group-containing monomer is contained in an amount preferably of not less than 0.2 mass %, and particularly preferably of 0.3 mass % to 10 mass %, relative to the composition for photoalignment film formation. The composition for photoalignment film formation can contain polymeric material(s) such as polyvinyl alcohol and polyimide, and/or a photosensitizer, provided that a characteristic of the photoalignment film is not seriously impaired.

Polarized light irradiation can be carried out in a mode in which a composition obtained by removing the solvent from the composition for photoalignment film formation, the composition having been applied to the base material, is directly irradiated with polarized light, or in a mode in which the composition is irradiated with polarized light that is incident on the base material and then is transmitted through the base material. The polarized light is particularly preferably substantially parallel light. Polarized light with which to irradiate the composition desirably has a wavelength in a wavelength region in which a photoreactive group of the photoreactive group-containing polymer or the photoreactive group-containing monomer can absorb light energy. Specifically, the polarized light with which to irradiate the composition is particularly preferably UV (ultraviolet ray) having a wavelength of 250 nm to 400 nm.

Note that, in a case where masking is carried out during rubbing or polarized light irradiation, it is possible to form a plurality of regions (patterns) that differ in direction of liquid crystal alignment.

<Groove Alignment Film>

A groove alignment film is a film whose surface is provided with an uneven pattern or a plurality of grooves. In a case where the polymerizable liquid crystal compound is applied to a film having a plurality of linear grooves that are provided at regular intervals, liquid crystal molecules are aligned in a direction along those grooves.

A method for obtaining the groove alignment film is exemplified by, for example, (i) a method in which a surface of a photosensitive polyimide film is exposed to light via an exposure mask having a pattern-shaped slit, and then an uneven pattern is formed by carrying out development and a rinse treatment, (ii) a method in which a plate-like matrix whose surface is provided with a groove is provided with a resin layer of a UV cured resin which has not been cured, and then the resin layer is cured after being moved to a base material, and (iii) a method in which irregularities are formed by pressing a roll matrix having a plurality of grooves against a film, provided on the base material, of the UV cured resin which has not been cured, and then the film is cured. The method for obtaining the groove alignment film is specifically exemplified by, for example, methods disclosed in Japanese Patent Application Publication, Tokukaihei, No. 6-34976 (1994) and Japanese Patent Application Publication, Tokukai, No. 2011-242743.

<Method for Producing Laminated Body>

A laminated body including the optically anisotropic layer, an adhesive agent layer, and a transfer receiving body can be produced by (i) forming the optically anisotropic layer on the base material, (ii) bonding the optically anisotropic layer to the transfer receiving body via the adhesive agent layer, and (iii) removing the base material.

Note that the adhesive agent layer can be provided on the optically anisotropic layer or on the transfer receiving body. In a case where the alignment film is provided between the base material and the optically anisotropic layer, it is possible to remove the alignment film together with the base material.

In a case of a base material whose surface has a functional group that is to form a chemical bond with an optically anisotropic layer, an alignment film, or the like, the functional group forms a chemical bond with the optically anisotropic layer, the alignment film, or the like, and therefore the base material tends to become difficult to remove. From this, in a case where the base material is to be peeled and removed, it is preferable to employ a base material whose surface has a small number of functional groups or it is preferable to employ a base material which has not been subjected to surface treatment for forming a functional group on a surface of the base material.

An alignment film which has a functional group by which a chemical bond is formed with a base material tends to cause greater adhesion between the base material and the alignment film. Therefore, in a case where the base material is to be peeled and removed, it is preferable to employ an alignment film which has a small number of functional groups by which a chemical bond is formed with the base material. A solution of the alignment polymer composition, the composition for photoalignment film formation, or the like preferably contains no reagent for cross-linking the base material with the alignment film, and preferably contains no component such as a solvent which dissolves the base material.

An alignment film which has a functional group by which a chemical bond is formed with an optically anisotropic layer tends to cause greater adhesion between the optically anisotropic layer and the alignment film. Therefore, in a case where the alignment film is to be removed together with the base material, it is preferable to employ an alignment film which has a small number of functional groups by which a chemical bond is formed with the optically anisotropic layer. A solution of the alignment polymer composition, the composition for photoalignment film formation, or the like preferably contains no reagent for cross-linking the alignment film with the optically anisotropic layer.

An optically anisotropic layer which has a functional group by which a chemical bond is formed with the alignment film tends to cause greater adhesion between the alignment film and the optically anisotropic layer. Therefore, in a case where the base material is to be removed or in a case where the alignment film is to be removed together with the base material, it is preferable to employ an optically anisotropic layer which has a small number of functional groups by which a chemical bond is formed with the base material or the alignment film. The composition preferably contains no reagent for cross-linking the base material or the alignment film with the optically anisotropic layer.

<Adhesive Agent Layer>

The adhesive agent layer is formed from an adhesive agent. Examples of the adhesive agent include a pressure-sensitive adhesive, a dry hardening adhesive agent, and a chemical reaction adhesive agent. The chemical reaction adhesive agent can be, for example, an active energy ray curing adhesive agent. The adhesive agent layer is preferably made of a pressure-sensitive adhesive or an active energy ray curing adhesive agent.

<Pressure-Sensitive Adhesive>

The pressure-sensitive adhesive contains a polymer.

Examples of the polymer include an acrylic polymer, a silicone polymer, polyester, polyurethane, polyether, and the like. It is preferable to employ an acrylic pressure-sensitive adhesive which contains an acrylic polymer among these, because such an acrylic pressure-sensitive adhesive is excellent in optical transparency, has moderate wettability and cohesive force, is excellent in adhesiveness, has high weatherability, heat resistance, and the like, and hardly causes floating, peeling, or the like under conditions of heating and/or humidification.

The acrylic polymer is preferably a copolymer of (i) (meth)acrylate in which an alkyl group of an ester moiety is a C1-C20 alkyl group such as a methyl group, an ethyl group, or a butyl group (hereinafter, acrylate and methacrylate are sometimes collectively referred to as "(meth)acrylate", and acrylic acid and methacrylic acid are sometimes collectively referred to as "(meth)acrylic acid") and (ii) a (meth)acrylic monomer having a functional group such as (meth)acrylic acid or hydroxyethyl (meth)acrylate.

It is preferable to employ a pressure-sensitive adhesive which contains the copolymer because such a pressure-sensitive adhesive is excellent in adhesion and the adhesive agent layer which is formed from the pressure-sensitive adhesive and which has been provided on the display device can be relatively easily removed from the display device without causing residual adhesive and/or the like.

The pressure-sensitive adhesive can contain a light diffusing agent. Examples of the light diffusing agent include fine particles of an inorganic compound and fine particles of an organic compound (polymer).

A thickness of the adhesive agent layer formed from the pressure-sensitive adhesive is determined in accordance with adhesion and the like of the adhesive agent layer, and is not limited to a particular one. Normally, the thickness of the adhesive agent layer is 1 µm to 40 µm. In view of processability, durability, and the like, the thickness is preferably 3 µm to 25 µm, and more preferably 5 µm to 20 µm. In a case where the thickness of the adhesive agent layer formed from the pressure-sensitive adhesive is 5 µm to 20 µm, it is possible to (i) maintain brightness when the display device is viewed from front or viewed obliquely and (ii) hardly cause bleeding and a blur in a displayed image.

<Dry Hardening Adhesive Agent>

Examples of the dry hardening adhesive agent include a polymer of monomers having (i) a protic functional group such as a hydroxyl group, a carboxyl group, or an amino group and (ii) an unsaturated ethylene group; a composition which contains urethane resin as a main component and further contains a crosslinking agent or a curable compound such as polyvalent aldehyde, an epoxy compound, epoxy resin, a melamine compound, a zirconia compound, or a zinc compound; and the like.

Examples of the polymer of monomers having (i) a protic functional group such as a hydroxyl group, a carboxyl group, or an amino group and (ii) an unsaturated ethylene group include an ethylene-maleic acid copolymer, an itaconic acid copolymer, an acrylic acid copolymer, an acrylamide copolymer, saponified polyvinyl acetate, polyvinyl alcohol resin, and the like.

The urethane resin can be polyester ionomer urethane resin or the like. The polyester ionomer urethane resin is urethane resin which has a polyester skeleton and to which a small amount of an ionic component (hydrophilic component) is introduced.

A thickness of the adhesive agent layer formed from the dry hardening adhesive agent is normally 0.001 µm to 5 µm, preferably 0.01 µm to 2 µm, and more preferably not more than 1 µm. In a case where the adhesive agent layer formed from the dry hardening adhesive agent is excessively thick, appearance of the optically anisotropic layer is more likely to become defective.

<Active Energy Ray Curing Adhesive Agent>

The active energy ray curing adhesive agent indicates an adhesive agent which is hardened in response to active energy ray irradiation.

Examples of the active energy ray curing adhesive agent include a cation polymerizable adhesive agent containing an epoxy compound and a cation polymerization initiator; a radical polymerizable adhesive agent containing an acrylic curing component and a radical polymerization initiator; an adhesive agent which contains (i) a cation polymerizable curing component such as an epoxy compound, (ii) a radical polymerizable curing component such as an acrylic compound, (iii) a cation polymerization initiator, and (iv) a radical polymerization initiator; an adhesive agent which does not contain those polymerization initiators and is hardened in response to electron beam irradiation; and the like. The active energy ray curing adhesive agent is preferably a radical polymerizable active energy ray curing adhesive agent which contains an acrylic curing component and a radical polymerization initiator. Alternatively, it is preferable to employ a cation polymerizable active energy ray curing adhesive agent which contains an epoxy compound and a cation polymerization initiator and can be used with substantially no solvent.

Examples of commercially-available products of the epoxy compound include "jER" Series (manufactured by Mitsubishi Chemical Corporation), "EPICLON" (manufactured by DIC Corporation), "Epototo" (Registered Trademark) (manufactured by TOHTO Chemical Industry Co., Ltd.), "ADEKA RESIN" (Registered Trademark) (manufactured by ADEKA CORPORATION), "Denacol" (Registered Trademark) (manufactured by Nagase ChemteX Corporation), "Dow Epoxy" (manufactured by Dow Chemical Company), "TEPIC" (Registered Trademark) (manufactured by Nissan Chemical Industries, Ltd.), and the like. Examples of an alicyclic epoxy compound include "CELLOXIDE" Series and "CYCLOMER" (each manufactured by DAICEL CORPORATION), "CYRACURE UVR" Series (manufactured by Dow Chemical Company), and the like.

The cation polymerization initiator is a compound which generates a cationic species in response to active energy ray irradiation such as ultraviolet ray irradiation. Examples of the cation polymerization initiator include aromatic diazonium salt; onium salts such as aromatic iodonium salt and aromatic sulfonium salt; and an iron-arene complex. These cation polymerization initiators can be used in only one kind or in combination of two or more kinds.

Examples of commercially-available products of the cation polymerization initiator include "KAYARAD" (Registered Trademark) Series (manufactured by Nippon Kayaku Co., Ltd.), "CYRACURE UVI" Series (manufactured by Dow Chemical Company), "CPI" Series (manufactured by San-Apro Ltd.), "TAZ", "BBI", and "DTS" (each manufactured by Midori Kagaku Co., Ltd.), "ADEKA OPTOMER" Series (manufactured by ADEKA CORPORATION), "Rhodorsil" (Registered Trademark) (manufactured by Rhodia Inc.), and the like.

Examples of the acrylic curing component include (meth)acrylate and (meth)acrylic acid such as methyl (meth)acrylate, hydroxyethyl (meth)acrylate, and the like.

Examples of the radical polymerization initiator include a hydrogen abstraction type photo-radical generator, a cleavage type photo-radical generator, and the like.

Examples of the hydrogen abstraction type photo-radical generator include a naphthalene derivative such as 1-methylnaphthalene; an anthracene derivative; a pyrene derivative; a carbazole derivative; a benzophenone derivative; a thioxanthone derivative; a coumarin derivative; and the like.

Examples of the cleavage type photo-radical generator include a benzoin ether derivative; arylalkyl ketones such as an acetophenone derivative; oxime ketones; acylphosphine oxides; thiobenzoic acid S-phenyls; titanocenes; high molecular weight derivatives of those; and the like.

Among the cleavage type photo-radical generators, the acylphosphine oxides are preferable. Specifically, it is preferable to use trimethylbenzoyl diphenylphosphine oxide (product name "DAROCURE TPO"; manufactured by BASF Japan Ltd.), bis(2,6-dimethoxy-benzoyl)-(2,4,4-trimethyl-pentyl)-phosphine oxide (product name "CGI 403"; manufactured by BASF Japan Ltd.), or bis(2,4,6-trimethylbenzoyl)-2,4-dipentoxyphenylphosphine oxide (product name "Irgacure 819"; manufactured by BASF Japan Ltd.).

The active energy ray curing adhesive agent can contain a sensitizer. The sensitizer is contained in an amount preferably of 0.1 parts by mass to 20 parts by mass, relative to 100 parts by mass of the active energy ray curing adhesive agent.

The active energy ray curing adhesive agent can further contain an ion trapping agent, an antioxidant, a chain transfer agent, a tackifier, thermoplastic resin, filler, a fluidity adjusting agent, a plasticizer, an anti-foaming agent, and the like.

In this specification, an active energy ray is defined as an energy ray which can generate an activated species by decomposing a compound which generates an activated species. Examples of such an active energy ray include visible light, an ultraviolet ray, an infrared ray, an X-ray, an α-ray, a β-ray, a γ-ray, an electron ray, and the like. It is preferable to employ an ultraviolet ray or an electron ray.

A thickness of the adhesive agent layer formed from the active energy ray curing adhesive agent is normally 0.001 μm to 5 μm, preferably not less than 0.01 μm. The thickness is preferably not more than 2 μm, and more preferably not more than 1 μm. In a case where the adhesive agent layer formed from the active energy ray curing adhesive agent is excessively thick, appearance of the optically anisotropic layer is more likely to become defective.

<Transfer Receiving Body>

Examples of the transfer receiving body include a substance made of a material identical to that of the base material, a polarizer, a polarizing plate, and the like.

<Polarizer and Polarizing Plate>

The polarizer has a polarizing function. Examples of the polarizer include a stretched film which has been caused to adsorb a pigment having absorption anisotropy; a film to which a pigment having absorption anisotropy has been applied; and the like. The pigment having absorption anisotropy can be a dichroic pigment.

The stretched film which has adsorbed a pigment having absorption anisotropy is normally produced through the steps of (i) uniaxially stretching a polyvinyl alcohol resin film, (ii) causing the polyvinyl alcohol resin film to adsorb a dichroic pigment by dyeing the polyvinyl alcohol resin film with the dichroic pigment, (iii) treating, with a boric acid aqueous solution, the polyvinyl alcohol resin film which has adsorbed the dichroic pigment, and (iv) washing the polyvinyl alcohol resin film with water after the polyvinyl alcohol resin film has been treated with the boric acid aqueous solution.

The dichroic pigment can be iodine or a dichroic organic dye. Examples of the dichroic organic dye include a dichroic direct dye which is made of a disazo compound such as C.I. DIRECT RED 39; a dichroic direct dye made of a compound such as a trisazo compound or a tetrakisazo compound; and the like.

The polarizer which has been obtained as above described, i.e., by subjecting the polyvinyl alcohol resin film to uniaxial stretching, dyeing with the dichroic pigment, boric acid treatment, washing with water, and drying has a thickness preferably of 5 μm to 40 μm.

Examples of the film to which a pigment having absorption anisotropy has been applied include a film which has been obtained by applying a composition that contains a dichroic pigment having liquid crystallinity; a film which has been obtained by applying a composition that contains a dichroic pigment and a polymerizable liquid crystal compound; and the like.

The film to which a pigment having absorption anisotropy has been applied is preferably thin. Note, however, that, in a case where the film to which a pigment having absorption anisotropy has been applied is excessively thin, strength of the film tends to decrease, and processability of the film tends to be deteriorated. A thickness of the film is normally not more than 20 μm, preferably not more than 5 μm, and more preferably 0.5 μm to 3 μm.

The film to which a pigment having absorption anisotropy has been applied can specifically be a film disclosed in Japanese Patent Application Publication, Tokukai, No. 2012-33249 or the like.

The polarizing plate can be obtained by laminating a transparent protective film on at least one surface of the polarizer via an adhesive agent. The transparent protective film is preferably a transparent film which is similar to the foregoing base material.

<Method for Producing Laminated Body>

As a method for applying the composition to the surface of the base material or a surface of the alignment film formed on the base material, a known method can be employed. Examples of the known method include: application methods such as spin coating, extrusion, gravure coating, die coating, bar coating, and an applicator method; and printing methods such as flexography. A thickness of the composition applied to the surface of the base material or the surface of the alignment film is determined in consideration of the thickness of the optically anisotropic layer to be obtained.

Next, the solvent contained in the composition is removed under a condition that the polymerizable liquid crystal compound is not polymerized. As a result, a dry film of the composition is formed on the surface of the base material or the surface of the alignment film. Examples of a method for removing the solvent include natural drying, draught drying, drying by heating, and drying under reduced pressure.

The dry film is, for example, heated so that the polymerizable liquid crystal compound contained in the dry film is subjected to liquid crystal alignment. The dry film is then irradiated with light while the liquid crystal alignment is retained. This causes the polymerizable liquid crystal compound to be polymerized.

Examples of a light source that emits light with which the dry film is irradiated include a xenon lamp, a high pressure mercury lamp, an extra-high pressure mercury lamp, a metal halide lamp, and an ultraviolet light laser such as KrF or ArF. Out of those examples, a high pressure mercury lamp, an extra-high pressure mercury lamp, or a metal halide lamp is preferably used.

The light source and the light with which the dry film is irradiated are each selected as appropriate depending on a kind of the photopolymerization initiator contained in the dry film or a kind of the polymerizable liquid crystal compound (especially, a kind of a polymerizable group in the polymerizable liquid crystal compound) and on an amount thereof. The light with which the dry film is irradiated preferably includes (i) light having a wavelength of less than 350 nm and (ii) light having a wavelength of not less than 350 nm. The polymerizable liquid crystal compound tends to be cured more sufficiently with use of such light. The light is preferably ultraviolet light because a progress of a polymerization reaction can be easily controlled and because light widely used in the present field for polymerization can be used. Therefore, the respective kinds of the polymerizable liquid crystal compound and the photopolymerization initiator, each of which is contained in the composition, are preferably selected so that the polymerizable liquid crystal compound is polymerized by ultraviolet light. The polymerizable liquid crystal compound is preferably polymerized by irradiation with ultraviolet light while a polymerization temperature is being controlled by cooling of the dry film with use of suitable cooling means. In a case where the polymerizable liquid crystal compound is polymerized at a lower temperature by such cooling, it is possible to properly produce the optically anisotropic layer even when a material having low heat resistance is used as the base material.

The optically anisotropic layer having the liquid crystal alignment is thus formed on the surface of the base material or the surface of the alignment film.

<Primer Layer>

A primer layer, made of a transparent resin such as an epoxy resin, can be provided between the optically anisotropic layer and the adhesive agent layer.

The adhesive agent layer is formed by applying the adhesive agent to a surface of the optically anisotropic layer or a surface of the primer layer. In a case where the adhesive agent contains a solvent, the adhesive agent layer is formed by (i) applying the adhesive agent to the surface of the optically anisotropic layer or the surface of the primer layer and (ii) removing the solvent. The adhesive agent layer formed from the pressure-sensitive adhesive can be also formed by a method in which: the pressure-sensitive adhesive is applied to a surface of a film which surface is subjected to mold releasing treatment; a solvent is removed so that the adhesive agent layer is formed on the surface of the film; the film, on the surface of which the adhesive agent layer is formed, is bonded to the surface of the optically anisotropic layer or the surface of the primer layer so that the adhesive agent layer is bonded to the surface of the optically anisotropic layer or the surface of the primer layer.

It is possible to further increase adhesion between the optically anisotropic layer or the primer layer and the adhesive agent layer by carrying out corona treatment.

As a method for applying the adhesive agent to the surface of the optically anisotropic layer, the surface of the primer layer, or the surface of the film which surface is subjected to mold releasing treatment, it is possible to employ a method identical to that taken as an example of the method for applying the alignment polymer composition to the base material. As a method for removing the solvent from the adhesive agent applied to the surface of the optically anisotropic layer, the surface of the primer layer, or the surface of the film which surface is subjected to mold releasing treatment, it is possible to employ a method identical to the method for removing the solvent from the alignment polymer composition.

<Circularly Polarizing Plate>

In a case where (i) the polarizer or the polarizing plate serves as the transfer receiving body and (ii) the optically anisotropic layer is one that is obtained by curing the composition in the state where the polymerizable liquid crystal compound is aligned in the direction parallel to the surface of the base material, a circularly polarizing plate, configured such that (a) the polarizer or the polarizing plate, (b) a first adhesive agent layer, (c) the optically anisotropic layer, and (d) a second adhesive agent layer are laminated in this order, is obtained by further forming the second adhesive agent layer on the optically anisotropic layer in the laminated body made up of the optically anisotropic layer, the first adhesive agent layer, and the polarizer or the polarizing plate. That is, the circularly polarizing plate at least includes the optically anisotropic layer and the polarizing plate.

By further forming another adhesive agent layer on the optically anisotropic layer in the laminated body made up of the optically anisotropic layer, the alignment film, the adhesive agent layer, and the polarizer or the polarizing plate, a circularly polarizing plate, configured such that (a) the polarizer or the polarizing plate, (b) a first adhesive agent layer, (c) the alignment film, (d) the optically anisotropic layer, and (e) a second adhesive agent layer are laminated in this order, is obtained.

<Application>

The optically anisotropic layer and the circularly polarizing plate can be used for various display devices.

A display device is a device including: a display element; and a light emitting element or a light emitting device serving as a light emitting source. Examples of the display device include a liquid crystal display device, an organic electroluminescent (EL) display device, an inorganic electroluminescent (EL) display device, a touch panel display device, an electron emission display device (a field emission display device (e.g., FED), a surface-conduction electron-emitter display device (SED)), electronic paper (a display device which employs electronic ink or an electrophoretic element), a plasma display device, projection display devices (e.g., a grating light valve (GLV) display device and a display device including a digital micromirror device (DMD)), a piezoelectric ceramic display, and the like. The liquid crystal display device includes all the following display devices: a transmissive liquid crystal display device, a semi-transmissive liquid crystal display device, a reflective liquid crystal display device, a direct-view liquid crystal display device, a projection liquid crystal display device, and the like. Each of those display devices can be a display device which displays a two-dimensional image or can be a stereoscopic display device which displays a three-dimensional image. Particularly, the circularly polarizing plate can be effectively used for the organic EL display device and the inorganic EL display device, and an optical compensation polarizing plate can be effectively used for the liquid crystal display device and the touch panel display device.

EXAMPLES

The present invention will be described below in more detail with reference to Examples and Comparative Examples. Note that "%" and "part(s)" in Examples and Comparative Examples mean "mass %" and "part(s) by mass," respectively, if not otherwise specified.

Polymer films, devices, and measurement methods used in Examples and Comparative Examples were as follows.

ZF-14, manufactured by Zeon Corporation, was used as a cycloolefin polymer (COP) film.

AGF-B10, manufactured by Kasuga Electric Works Ltd., was used as a corona treatment device.

Corona treatment was carried out once with use of the above corona treatment device under conditions of (i) output of 0.3 kW and (ii) a treatment speed of 3 m/min.

SPOT CURESP-7 equipped with a polarizer unit, manufactured by Ushio Inc., was used as a polarized UV light irradiation device.

Unicure VB-15201BY-A, manufactured by Ushio Inc., was used as a high pressure mercury lamp.

KOBRA-WR, manufactured by Oji Scientific Instruments Co., Ltd., was used to measure an in-plane phase difference value.

An ellipsometer M-220, manufactured by JASCO Corporation, was used to measure a thickness of a film.

Examples 1 Through 26

Preparation of Composition for Photoalignment Film Formation 5 parts of a photoalignment material, having the following structure, and 95 parts of cyclopentanone (solvent) were mixed together as components. A resultant mixture was stirred at 80° C. for 1 (one) hour to obtain a composition for photoalignment film formation. The photoalignment material was synthesized in accordance with a method described in Japanese Patent Application Publication, Tokukai, No. 2013-33248.

[Chem. 3]

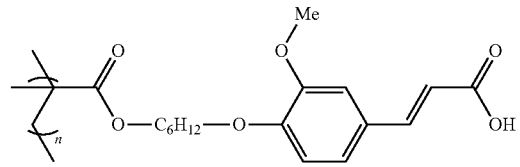

[Preparation of Composition Containing Polymerizable Liquid Crystal Compound]

A polymerizable liquid crystal A having the following structure, a polyacrylate compound (leveling agent) (BYK-361N; manufactured by BYK Chemie), and a photopolymerization initiator(s) out of those listed below were mixed together as components to obtain a composition containing a polymerizable liquid crystal compound (the composition in accordance with the present invention).

[Chem. 4]

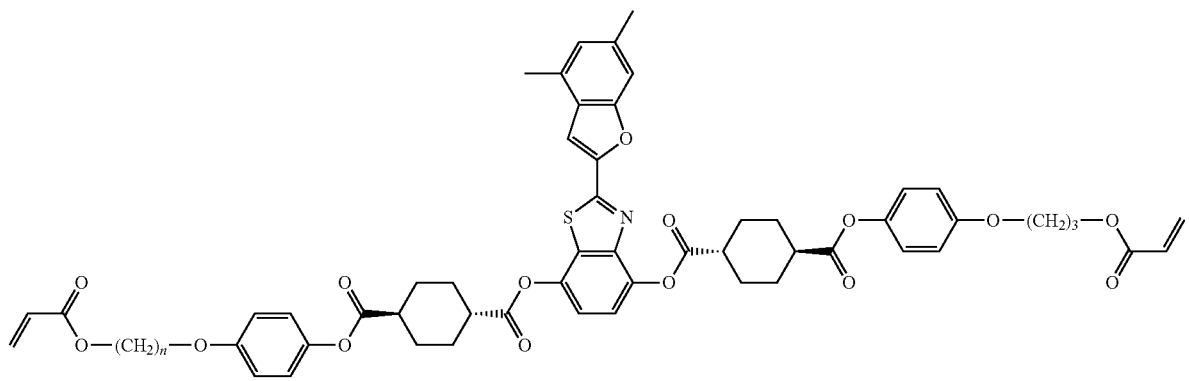

The polymerizable liquid crystal A was synthesized by a method disclosed in Japanese Patent Application Publication, Tokukai, No. 2010-31223. A wavelength $\lambda_{max}(LC)$ at which the polymerizable liquid crystal A had a maximum absorption was 350 nm.

An amount of the polyacrylate compound was 0.01 parts, relative to 100 parts of the polymerizable liquid crystal A.

The photopolymerization initiator(s) was/were selected from the following five kinds of photopolymerization initiators. In each of Examples, the photopolymerization initiator(s) shown in the following Table 1 was/were added in an amount(s) shown in Table 1 with respect to 100 parts of the polymerizable liquid crystal A. Note that Table 1 also shows a wavelength $\lambda(A)$ and a wavelength $\lambda(B)$ at each of which each of the photopolymerization initiators has a maximum absorption.

Irgacure OXE-03 (manufactured by BASF Japan Ltd.)
ADEKA ARKLS NCI-831 (manufactured by ADEKA CORPORATION)
1-hydroxy-cyclohexyl-phenyl-ketone (Irgacure 184 (Irg184); manufactured by BASF Japan Ltd.)
2-dimethylamino-2-benzil-1-(4-morpholinophenyl) butane-1-one (Irgacure 369 (Irg369); manufactured by BASF Japan Ltd.)
2,2-dimethoxy-1,2-diphenylethane-1-one (Irgacure 651 (Irg651); manufactured by BASF Japan Ltd.)

[Production of Optically Anisotropic Layer]

To the composition containing the polymerizable liquid crystal compound, N-methyl-2-pyrrolidone (NMP) was added as a solvent so that a solid content concentration was 13%. A resultant mixture was stirred at 80° C. for 1 (one) hour to obtain a coating liquid.

Meanwhile, a cycloolefin polymer (COP) film serving as a base material was subjected to corona treatment with use of a corona treatment device. Next, the composition for photoalignment film formation was applied, with use of a bar coater, to a surface of the COP film (base material) thus subjected to the corona treatment. The composition for photoalignment film formation was then dried at 80° C. for 1 (one) minute, and exposed to polarized UV light in an accumulated amount of 100 mJ/cm² with use of a polarized UV light irradiation device. As a result, an alignment film was obtained. The alignment film thus obtained had a thickness of 122 nm.

Subsequently, the coating liquid was applied to the alignment film with use of a bar coater, and then dried at 120° C. for 1 (one) minute. With use of a high pressure mercury lamp, the coating liquid was irradiated with an ultraviolet ray from a surface of the alignment film to which surface the coating liquid was applied (under a nitrogen atmosphere, wavelength: 365 nm, an accumulated amount at a wavelength of 365 nm was as shown in Table 1), so that an optically anisotropic layer was formed. Meanwhile, a COP film serving as a transfer receiving body was subjected to corona treatment with use of the corona treatment device.

An adhesive agent layer was bonded to the optically anisotropic layer thus obtained, and then the optically anisotropic layer was bonded to the COP film (transfer receiving body), which was subjected to the corona treatment, via the adhesive agent layer. Thereafter, the COP film serving as a base material was peeled to obtain an optical film configured such that the optically anisotropic layer was transferred to the COP film serving as a transfer receiving body. In so doing, only the optically anisotropic layer was transferred to the COP film serving as a transfer receiving body, and the alignment film remained on the COP film serving as a base material. A result of evaluating a transfer property of the optically anisotropic layer is shown in Table 1.

TABLE 1

| | Amount of Initiator (part by mass) | | | | | | |
|---|---|---|---|---|---|---|---|
| | OXE-03 | NCI-831 | Irg184 | Irg369 | Irg651 | Accumulated Amount at Wavelength of 365 nm mJ/cm² | Transfer Property |
| | Wavelength $\lambda(A)$ of Maximum Absorption/nm | | | | | | |
| | 305 | 300 | 340 | 320 | 330 | | |
| | Wavelength $\lambda(B)$ of Maximum Absorption/nm | | | | | | |
| | 355 | 370 | — | — | — | | |
| Example 1 | 3 | | | | | 1000 | A |
| Example 2 | 3 | | | | | 500 | A |
| Example 3 | 12.5 | | | | | 1000 | A |
| Example 4 | 12.5 | | | | | 500 | A |
| Example 5 | | 3 | | | | 1000 | A |
| Example 6 | | 3 | | | | 500 | A |
| Example 7 | | 3 | | 3 | | 1000 | A |
| Example 8 | | 3 | | 3 | | 500 | A |
| Example 9 | 7.5 | | | 3 | | 1000 | A |
| Example 10 | 7.5 | | | 3 | | 500 | A |
| Example 11 | 12.5 | | | 3 | | 1000 | A |
| Example 12 | 12.5 | | | 3 | | 500 | A |
| Example 13 | 10 | 1 | | 3 | | 1000 | A |
| Example 14 | 10 | 1 | | 3 | | 500 | A |
| Example 15 | | 6 | | | | 1000 | A |
| Example 16 | | 6 | | | | 500 | A |
| Example 17 | | 3 | | | 15 | 1000 | A |
| Example 18 | | 3 | | | 15 | 500 | A |
| Example 19 | | | | 3 | 15 | 1000 | A |
| Example 20 | | | | 3 | 15 | 500 | C |
| Example 21 | | 21 | | | | 1000 | B |
| Example 22 | | 21 | | | | 500 | B |
| Example 23 | 11 | 11 | | | | 1000 | B |
| Example 24 | 11 | 11 | | | | 500 | B |
| Example 25 | 3 | | | 6 | | 1000 | A |

TABLE 1-continued

| | Amount of Initiator (part by mass) | | | | | | |
|---|---|---|---|---|---|---|---|
| | OXE-03 | NCI-831 | Irg184 | Irg369 | Irg651 | Accumulated Amount at | |
| | Wavelength λ(A) of Maximum Absorption/nm | | | | | | |
| | 305 | 300 | 340 | 320 | 330 | Wavelength of 365 nm | Transfer |
| | Wavelength λ(B) of Maximum Absorption/nm | | | | | | |
| | 355 | 370 | — | — | — | mJ/cm² | Property |
| Example 26 | 3 | | | 6 | | 500 | A |
| Comparative Example 1 | | | 3 | | 3 | 1000 | E |
| Comparative Example 2 | | | 3 | | 3 | 500 | E |
| Comparative Example 3 | | | | 3 | | 1000 | E |
| Comparative Example 4 | | | | 3 | | 500 | E |

*The transfer property was evaluated as follows:
A: the optically anisotropic layer had no transfer defect;
B: the optically anisotropic layer had no transfer defect, but had an alignment defect;
C: the optically anisotropic layer was transferred to the COP film serving as a transfer receiving body, but had a streak defect; and
E: the optically anisotropic layer was not transferred to the COP film serving as a transfer receiving body.

An in-plane phase difference value of the optical film thus obtained was measured with respect to each of light having a wavelength of 450 nm, light having a wavelength of 550 nm, and light having a wavelength of 650 nm. As a result, in Example 1, the in-plane phase difference value ranged from 120 nm to 150 nm, and the following relationship was found in regard to the in-plane phase difference value with respect to each of the light having a wavelength of 450 nm, the light having a wavelength of 550 nm, and the light having a wavelength of 650 nm.

$Re(450)/Re(550)=0.87$ $Re(650)/Re(550)=1.02$ wherein: Re(450) represents an in-plane phase difference value with respect to light having a wavelength of 450 nm; Re(550) represents an in-plane phase difference value with respect to light having a wavelength of 550 nm; and Re(650) represents an in-plane phase difference value with respect to light having a wavelength of 650 nm).

That is, the optically anisotropic layer had an optical characteristic represented by the following Formulae (1), (2), and (3). Note that an in-plane phase difference value of COP at a wavelength of 550 nm is approximately 0 (zero). Therefore, the in-plane phase difference value of COP does not affect the optical characteristic represented by Formulae (1) through (3).

$Re(450)/Re(550) \leq 1.00$ (1)

$1.00 \leq Re(650)/Re(550)$ (2)

$100 \text{ nm} < Re(550) < 160 \text{ nm}$ (3)

Also in each of Examples 2 through 26, similar results were obtained. Note, however, that, while it was possible to transfer an optically anisotropic layer to a COP film serving as a transfer receiving body without causing a transfer defect in Example 19, a streak defect was found on an optically anisotropic layer transferred to a COP film serving as a transfer receiving body in Example 20 in which an accumulated amount of a ultraviolet ray was half of that in Example 19. Furthermore, in each of Examples 21 through 26, although it was possible to transfer an optically anisotropic layer to a COP film serving as a transfer receiving body without causing a transfer defect, an alignment defect was found in the optically anisotropic layer transferred to the COP film.

Comparative Examples 1 Through 4

In a manner similar to that in Example 1, an optical film, configured such that an optically anisotropic layer was transferred to a COP film serving as a transfer receiving body, was obtained. A photopolymerization initiator(s) used in each of Comparative Examples 1 through 4 and an amount(s) of the photopolymerization initiator(s) are shown in Table 1. An accumulated amount of an ultraviolet ray having a wavelength of 365 nm is shown in Table 1. A result of evaluating a transfer property of the optically anisotropic layer is shown in Table 1. In each of Comparative Examples 1 through 4, the photopolymerization initiator(s) did not have a maximum absorption at a wavelength λ(B). Therefore, a function of the photopolymerization initiator(s) was inhibited by a polymerizable liquid crystal compound. As a result, the polymerizable liquid crystal compound was not sufficiently polymerized, and accordingly it was not possible to transfer the optically anisotropic layer to the COP film serving as a transfer receiving body.

INDUSTRIAL APPLICABILITY

According to the present invention, it is possible to sufficiently cure a polymerizable liquid crystal compound. It is therefore possible to provide (i) a composition from which an optically anisotropic layer that hardly has a transfer defect during a transfer is capable of being produced and (ii) a display device and the like including the optically anisotropic layer. The composition of the present invention can be widely used, for example, for display devices such as an organic electroluminescence (EL) display device and a touch panel display device.

The invention claimed is:
1. An optically anisotropic layer produced from a composition comprising at least one kind of polymerizable liquid crystal compound and a photopolymerization initiator composition,
   wherein the photopolymerization initiator composition comprises at least one kind of photopolymerization initiator,
   the photopolymerization initiator composition has (i) a maximum absorption at wavelength λ(A) and (ii) a maximum absorption at wavelength λ(B), and
   the at least one kind of polymerizable liquid crystal compound and the photopolymerization initiator composition satisfy the following:

20 nm<λ(B)−λ max(LC) or 20 nm<λ max(LC)−λ(A), wherein λmax(LC) represents a wavelength at which the at least one kind of polymerizable liquid crystal compound has a maximum absorption, the at least one kind of polymerizable liquid crystal compound satisfies the following:

300 nm≤λ max(LC)≤380 nm, the at least one kind of polymerizable liquid crystal compound and the photopolymerization initiator composition satisfy the following:

λ(A)<λ max(LC)<λ(B), wherein the optically anisotropic layer has an optical characteristic represented by the following Formulae (1)-(3):

$$Re(450)/Re(550) \leq 1.00 \tag{1}$$

$$1.00 Re(650)/Re(550) \tag{2}$$

$$100 \text{ nm} < Re(550) < 160 \text{ nm} \tag{3}$$

wherein: Re(450) represents an in-plane phase difference value with respect to light having a wavelength of 450 nm; Re(550) represents an in-plane phase difference value with respect to light having a wavelength of 550 nm; and Re(650) represents an in-plane phase difference value with respect to light having a wavelength of 650 nm.

2. An optical film comprising an optically anisotropic layer recited in claim 1.

3. A circularly polarizing plate comprising:
an optically anisotropic layer recited in claim 1; and
a polarizing plate.

4. An organic electroluminescence display device comprising a circularly polarizing plate recited in claim 3.

5. A touch panel display device comprising a circularly polarizing plate recited in claim 3.

6. The optically anisotropic layer according to claim 1, wherein the photopolymerization initiator composition is in an amount of 0.1 parts by mass to 30 parts by mass relative to 100 parts by mass of the polymerizable liquid crystal compound.

* * * * *